United States Patent
Seguchi et al.

[11] Patent Number: 6,110,845
[45] Date of Patent: Aug. 29, 2000

[54] PROCESS FOR FABRICATING SOI SUBSTRATE WITH HIGH-EFFICIENCY RECOVERY FROM DAMAGE DUE TO ION IMPLANTATION

[75] Inventors: Youhei Seguchi; Nobuaki Tokushige, both of Nara, Japan

[73] Assignee: Sharp Kabushiki Kaisha, Osaka, Japan

[21] Appl. No.: 09/055,306

[22] Filed: Apr. 6, 1998

[30] Foreign Application Priority Data

Apr. 11, 1997 [JP] Japan ................................ 9-092659

[51] Int. Cl.$^7$ .......................... H01L 21/324; H01L 21/26
[52] U.S. Cl. .......................... 438/795; 438/407; 438/423; 438/DIG. 967
[58] Field of Search ................. 438/404, 407, 438/423, 311, DIG. 967, 795, 799; 148/1.5, 175; 117/43; 257/347

[56] References Cited

U.S. PATENT DOCUMENTS

| | | |
|---|---|---|
| 4,181,538 | 1/1980 | Narayan et al. . |
| 4,431,459 | 2/1984 | Teng . |
| 4,454,526 | 6/1984 | Nishizawa et al. . |
| 4,523,370 | 6/1985 | Sullivan et al. . |
| 5,120,666 | 6/1992 | Gotou . |

FOREIGN PATENT DOCUMENTS

| | | |
|---|---|---|
| 0 675 534 | 10/1995 | European Pat. Off. . |
| 89 12317 | 12/1989 | WIPO . |
| 95 31825 | 11/1995 | WIPO . |

OTHER PUBLICATIONS

A. Gat and J. F. Gibbons "A Laser–Scanning Apparatus for Annealing of Ion–Implantation Damage in Semiconductors", Appl. Phys, Lett. 32(3), p. 142, Feb. 1, 1978.

S. M. Sze, VLSI TEchnology, second edition, p. 366–370, 1988.

Patent Abstracts of Japan No. 05335530, Dec. 17, 1993, "Method Of Manufacture SOI Substrate", Sony Corporation, Gomi Takayuki, Application No. 04162306, filed May 28, 1992.

Kawazu et al, "Effects of Oxygen Concentration and Annealing Sequence on Microstructure of Separation by Implanted Oxygen Wafer with High–Temperature Annealing", Japanese Journal of Applied Physics, vol. 30, No. 1, Jan. 1, 1991, pp. 112–115.

Patent Abstracts of Japan, No. 07263538A, Oct. 13, 1995, "SOI Substrate And Manufacture Thereof" Komatsu Electron Metals Co. Ltd. Nippon Telegr & Teleph Corp, NTT Electron Technol KK, Sadao et al. Application JP 06076538, filed Mar. 23, 1994.

*Primary Examiner*—Charles Bowers
*Assistant Examiner*—Evan Pert
*Attorney, Agent, or Firm*—Nixon & Vanderhye P.C.

[57] ABSTRACT

First, oxygen ions of a high concentration are implanted into a silicon substrate 1, by which a high-concentration oxygen implanted layer 3 is formed. Subsequently, a heat treatment for about 4 hours at 1350° C. is carried out in an atmosphere of Ar with a 0.5% concentration oxygen for the formation of a buried oxide layer 5. Next, pulse laser annealing is performed for melting and recrystallization of the surface silicon layer. Pulsed laser beam is radiated at an energy density of 1200 mJ/cm$^2$ or more. The pulsed laser beam is able to melt the semiconductor surface in several 10's nsec by virtue of its extremely large power density in irradiation of $10^7$ W/cm$^2$. By iterating this pulse laser annealing, the surface silicon layer iterates to melt and recrystallize, activating the activities of crystal defects, by which damage recovery based on crystal seeds is accomplished.

2 Claims, 2 Drawing Sheets

PROCESS FOR FABRICATING SOI SUBSTRATE WITH HIGH-EFFICIENCY RECOVERY FROM DAMAGE DUE TO ION IMPLANTATION

BACKGROUND OF THE INVENTION

The present invention relates to a process for fabricating an SOI (Silicon-on-Insulator) substrate, using a SIMOX (Separation by Implantation of Oxygen) process, in which a silicon oxide film is formed within a silicon substrate by ion-implanting oxygen into a single-crystal silicon substrate.

As one of the processes for fabricating very-large-scale integrated circuits, the SOI technique has been attracting attention in terms of high integration and low power consumption. Among known processes for fabricating SOI substrates in which a silicon layer is formed on an insulating substrate, are a laser re-crystallization process and a substrate bonding process in which single-crystal silicon substrates are bonded together via an insulating film. Further, the so-called SIMOX process in which oxygen is ion-implanted into a silicon substrate has also been in use.

This SIMOX process is a process in which oxygen ions are implanted to high concentration so that a silicon oxide layer is provided in a specified-depth region of the silicon substrate. In this process, heat treatment is performed for recovery from any damage due to the ion implantation.

As a prior art technique, the process for fabricating SOI substrates is described by referring to Japanese Patent Laid-Open Publication HEI 7-263538.

First, with ion implantation equipment, oxygen ions O$^+$ are implanted to a specified depth in a single-crystal silicon substrate 21 shown as step (A) of FIG. 2. In this case, in order to avoid any increase in dislocation density in a surface silicon single-crystal layer 22 and any decrease in the strength of breakdown electric field of a buried oxide film 25 shown in step (C) of FIG. 2, the amount of oxygen ion implantation is less than $0.5 \times 10^{18}$ cm$^{-2}$. In addition, reference numeral 23 denotes a high-concentration oxidized ion implantation layer.

Next, as shown in step (B) of FIG. 2, with CVD (Chemical Vapor Deposition) equipment, an SiO$_2$ anneal protection film 24 is formed on the surface of the single-crystal silicon substrate 21 (formation of protective film (second step (B))). However, it is also possible to go to the succeeding third step (C) of FIG. 2 without forming the anneal protection film 24.

Next, as shown in step (C) of FIG. 2, the substrate 21 is put into an oven held at 850° C. in an Ar gas atmosphere of a 0.5% oxygen partial pressure, and increased in temperature to 1350° C. (annealing process (third step (C))). Through this annealing process, the substrate is stabilized so that the high-concentration oxygen ion implanted layer 23 changes into the buried oxide film 25. In addition, reference numeral 26 denotes an anneal oxide film.

Next, the single-crystal silicon substrate 21 is subjected to heating treatment for several hours within a temperature range from 1150° C. to less than the melting point temperature (high temperature oxidation process (fourth step)). In this process, the O$_2$ gas concentration should be held within a range of more than 1% up to 100%.

As a result of performing the above heating process, the following three kinds of improvements are obtained.

First, as shown in steps (D) and (E) of FIG. 2, an increment 27 of the buried oxide film 25 formed in the annealing process is formed as a step for thickening the buried oxide film 25. In addition, reference numeral 28 denotes a surface oxide film increased by high-temperature oxidation.

Also, as shown in steps (F) and (G) of FIG. 2, as a pin-hole reduction step, when particles have deposited on the surface of the single-crystal silicon substrate 21 in the implantation of oxygen ions, pin holes 29 of the buried oxide film 25 are repaired.

Further, as shown in steps (H) and (I) of FIG. 2 for flattening the buried oxide film 25, pits and projections of the top surface of the buried oxide film 25 are flattened by a buried oxide film increment 27. In addition, after the anneal film 26 formed in the above step (C) shown in FIG. 2 is removed, the steps (D) to (I) shown in FIG. 2 may be performed.

Next, as shown in step (J) of FIG. 2, a sacrificing oxidation process is performed with a view to thinning the surface silicon single-crystal layer 22. This sacrificing oxidation may be performed after the removal of the surface oxide film 28. Also, the sacrificing oxidation step may be placed between the annealing process and the high-temperature oxidation process. Furthermore, this sacrificing oxidation process may be carried out after the removal of the anneal oxide film 26.

In the above processes, it is also possible that the annealing process (C) of FIG. 2 is carried out under temperature elevation and, subsequent to the temperature elevation, high-temperature oxidation is performed. Annealing is performed during the process of elevating the oven temperature, where the oven temperature is held constant at a temperature over 1200° C., for example, 1350° C. Then, an increased amount of oxygen is supplied to within the oven after the temperature elevation, so that the internal oxygen partial pressure is adjusted to be a high concentration around 70%. Thus, the high-temperature oxidation process of the fourth step is accomplished.

However, in the process of forming the buried oxide film on the silicon substrate through the annealing process by implanting oxygen ions into a single-crystal silicon substrate, because the silicon oxide film is formed in the silicon substrate by implantation of oxygen ions, there occurs a penetration dislocation to the surface silicon layer. This would incur characteristic deteriorations of transistors and dielectric strength defects of the buried oxide film.

SUMMARY OF THE INVENTION

The object of the present invention is therefore to provide a process for fabricating SOI substrates, which enables high-efficiency recovery from damage due to ion implantation.

In order to achieve the aforementioned object, the present invention provides a process for fabricating SOI substrates comprising:

after ion-implanting oxygen to a specified-depth region of a single-crystal silicon substrate, forming a silicon oxide film in the oxygen-ion implanted region by heat treatment; and recovering damage of the silicon substrate due to the ion implantation by performing pulse laser annealing on silicon of the single-crystal silicon substrate present on its surface side over the silicon oxide film.

An embodiment further comprises iterative melting and recrystallization of the silicon present on the surface side over the silicon oxide film by iterating the pulse laser annealing.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
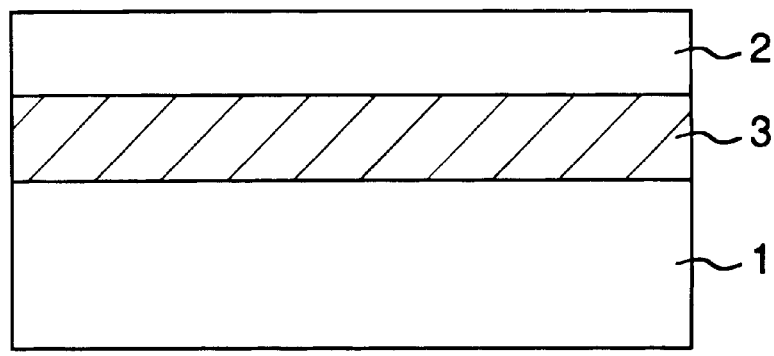
FIGS. 1A, 1B and 1C are process diagrams for fabricating an SOI substrate according to an embodiment of the present invention.
Figure 1B:
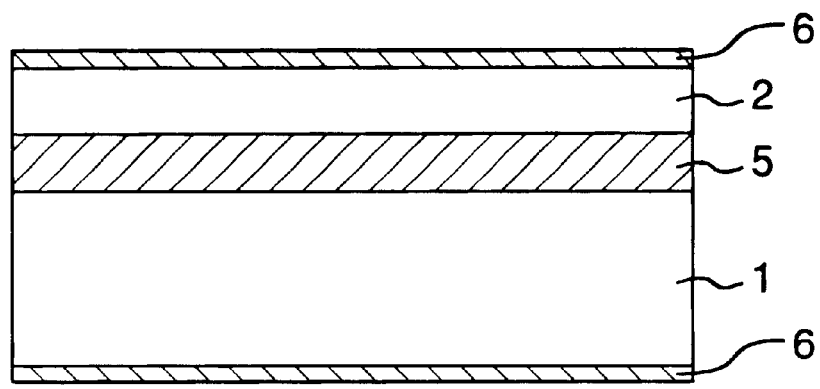
Figure 1C:
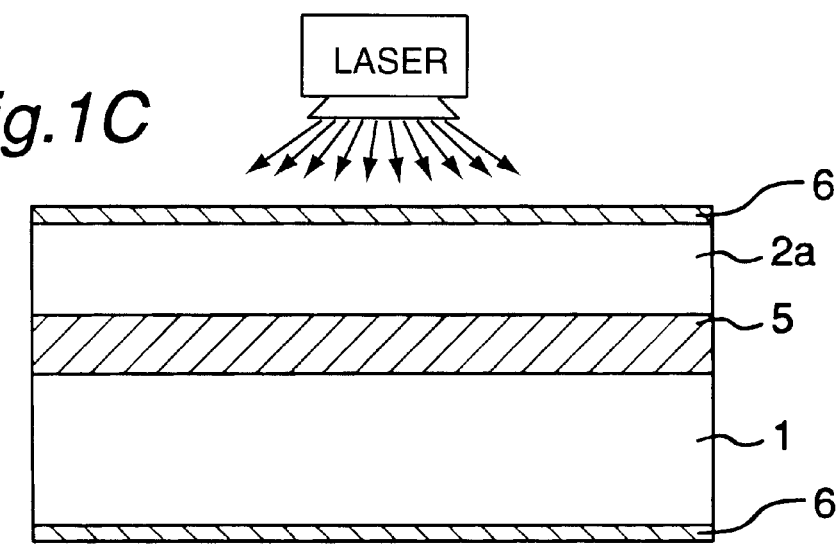
Figure 2:
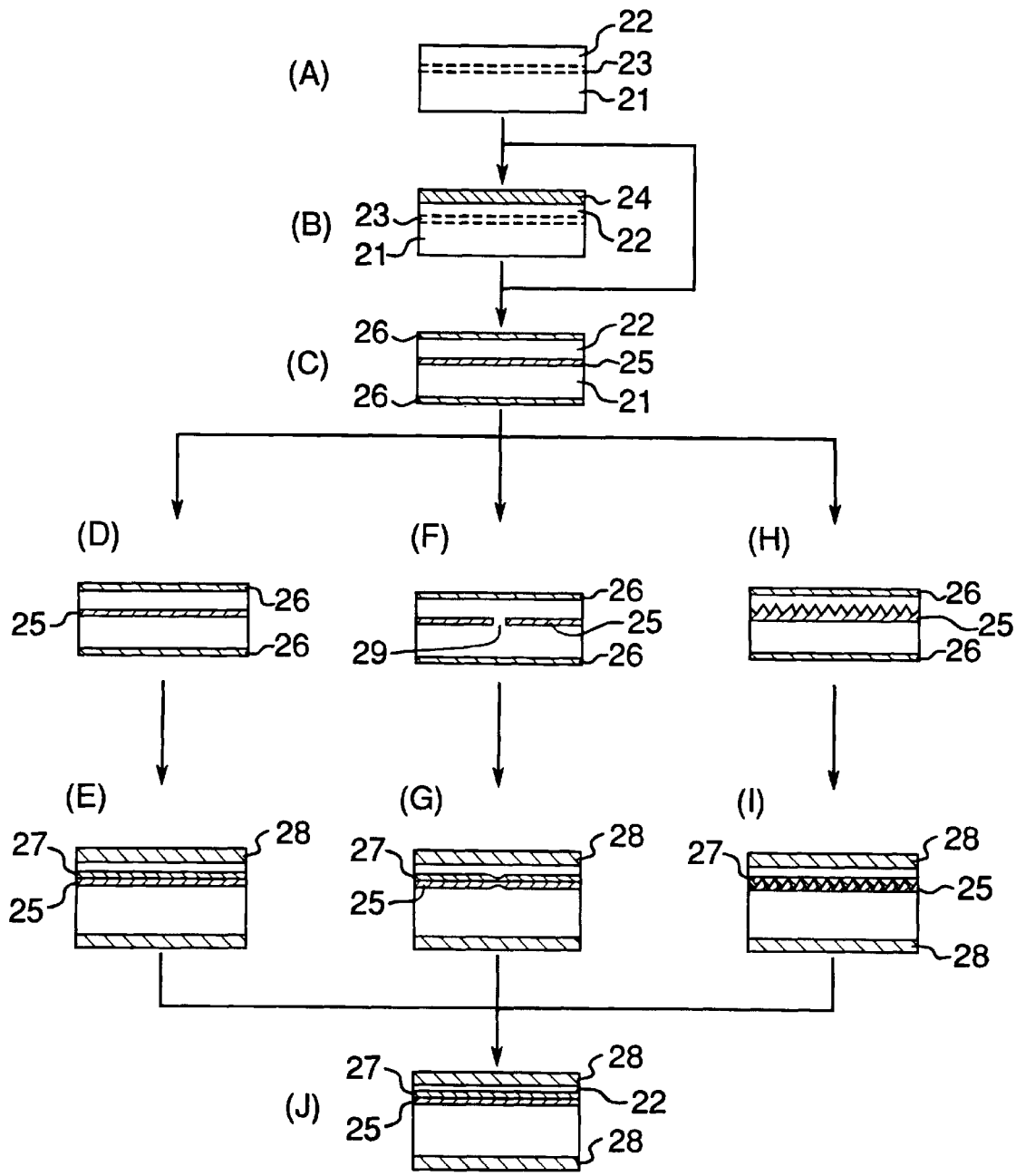
FIG. 2 is a process diagram for fabricating an SOI substrate according to the prior art.

Hereinbelow, the present invention is described in detail with reference to an embodiment thereof as shown in FIGS. 1A, 1B and 1C. FIGS. 1A, 1B and 1C are process diagrams for fabricating an SOI substrate according to an embodiment of the present invention. Referring to FIGS. 1A, 1B and 1C, reference numeral 1 denotes a single-crystal silicon substrate, 2 denotes a surface single-crystal silicon layer, 2a denotes a damage-recovered surface single-crystal silicon layer, 3 denotes a high-concentration oxygen ion implanted layer, 5 denotes a buried oxide film, and 6 denotes an anneal oxide film.

First, with suitable ion implantation equipment, as shown in FIG. 1A, oxygen ions of a high concentration are implanted into the silicon substrate 1, for example, with an implantation energy of 180 keV and a dose of $0.4 \times 10^{18}$ cm$^{-2}$. Oxygen atoms introduced into the silicon substrate 1 by this ion implantation are distributed according to a projected range in a specified-depth region of the silicon substrate 1, being implanted to a high concentration. As a result, the oxygen atoms form the high-concentration oxygen implanted layer 3 that makes the buried oxide layer 5, which is an insulator.

Since oxygen is implanted with a specified energy, a silicon layer of low concentration of oxygen atoms remains on the surface side of the silicon oxide layer 3. However, because a multiplicity of oxygen atoms have passed therethrough, the silicon layer results in a state of damaged crystallinity, thus unsuitable for device formation at this stage.

Subsequently, as shown in FIG. 1B, a heat treatment for about 4 hours at 1350° C. is carried out in an atmosphere of Ar with a 0.5% concentration oxygen for forming the buried oxide layer 5 from the high-concentration oxygen implanted layer 3. In this process, the addition of oxygen of a 0.50% concentration purposes to prevent occurrence of pits in the substrate surface. Also, because pulse laser annealing is performed after the heat treatment, the heat treatment may be done at a temperature below 1350° C., for example, around 1100° C.

Next, as shown in FIG. 1C, pulse laser annealing is performed for melting and recrystallization of the surface single-crystal silicon layer 2. A pulsed laser beam (ArF, XeCl, XeF laser beam or the like) is radiated at an energy density of 1200 mJ/cm$^2$ or more. The pulsed laser beam passes through the silicon oxide film 6 formed in the surface single-crystal silicon layer 2 by the foregoing heat treatment, and is able to melt the surface single-crystal silicon layer 2 in several 10's nsec by virtue of its large absorption coefficient to semiconductor (energy is absorbed by the surface alone), its irradiation time of 20 to 60 nsec, and its extremely large power density in irradiation of $10^7$ W/cm$^2$.

By this pulse laser annealing, the surface single-crystal silicon layer 2 melts and recrystallizes, activating the activities of crystal defects, by which damage recovery based on crystal seeds is accomplished. As a result, a surface single-crystal silicon layer 2a that has been reduced in defect density of the surface silicon and recovered from damage is obtained. Also by iterating the melting and recrystallization by iterating radiation of this pulsed laser beam, the defect density can be further reduced. For example, after the surface silicon layer 2 is melted by performing the pulsed laser annealing, the surface silicon layer 2 lowers to a temperature (around 570° C.) half the melting point of silicon, thus being recrystallized, and then the pulse laser annealing is performed again.

As described above in detail, employing the present invention makes it possible to reduce the defect density of the surface silicon layer. This allows high-quality SOI substrates to be realized at low temperature and low cost, which in turn facilitates the formation of various types of devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for fabricating a silicon-on-insulator substrate comprising:

a. implanting oxygen ions to a surface region of a single crystal silicon substrate, to form an oxygen-implanted region of the substrate;

b. heating the substrate to form a silicon oxide film on the oxygen-ion implanted region; and c. repairing damage to the silicon substrate due to the ion implantation by pulse laser annealing silicon of the single-crystal silicon substrate present on its surface side over the silicon oxide film, wherein the applied energy density of the laser is 1200 mJ/cm$^2$ or greater.

2. The process for fabricating a silicon-on-insulator substrate according to claim 1, further comprising iterative melting and recrystallization of the silicon present on the surface side over the silicon oxide film by reiterating the pulse laser annealing step.

* * * * *